United States Patent
Singer

(10) Patent No.: US 6,927,977 B2
(45) Date of Patent: Aug. 9, 2005

(54) BLOWER EXHAUST FOR A CLOSED FRAME

(75) Inventor: Thomas H. Singer, Oviedo, FL (US)

(73) Assignee: Siemens Communications, Inc., Boca Raton, FL (US)

( * ) Notice: Subject to any disclaimer, the term of this patent is extended or adjusted under 35 U.S.C. 154(b) by 13 days.

(21) Appl. No.: 10/365,295

(22) Filed: Feb. 12, 2003

(65) Prior Publication Data

US 2003/0151894 A1 Aug. 14, 2003

Related U.S. Application Data

(60) Provisional application No. 60/356,430, filed on Feb. 12, 2002.

(51) Int. Cl.[7] .................................................. H05K 5/00
(52) U.S. Cl. ..................... 361/695; 361/690; 312/223.2
(58) Field of Search ................................. 361/687, 688, 361/694, 695, 690, 692, 693; 312/223.1, 223.2, 236; 454/184; 165/80.3; 236/11; 337/115; 248/300

(56) References Cited

U.S. PATENT DOCUMENTS

| | | | | |
|---|---|---|---|---|
| 4,502,099 A | * | 2/1985 | Manes et al. ................ | 361/691 |
| 4,665,466 A | | 5/1987 | Green ......................... | 361/384 |
| 4,767,262 A | * | 8/1988 | Simon ......................... | 415/119 |
| 4,949,218 A | | 8/1990 | Blanchard et al. .......... | 361/384 |
| 5,747,734 A | | 5/1998 | Kozlowski et al. ............ | 174/50 |
| 5,914,858 A | | 6/1999 | McKeen et al. .............. | 361/695 |
| 5,995,368 A | | 11/1999 | Lee et al. .................... | 361/695 |
| 6,104,608 A | | 8/2000 | Casinelli et al. ............. | 361/692 |
| 6,141,213 A | * | 10/2000 | Antonuccio et al. ......... | 361/687 |
| 6,151,210 A | | 11/2000 | Cercioglu et al. ........... | 361/690 |
| 6,198,627 B1 | | 3/2001 | Roehling et al. ............ | 361/688 |
| 6,301,108 B1 | | 10/2001 | Stockbridge ................ | 361/688 |
| 6,414,845 B2 | * | 7/2002 | Bonet ......................... | 361/695 |
| 6,626,507 B2 | * | 9/2003 | Dean ......................... | 312/223.2 |
| 6,646,867 B1 | * | 11/2003 | Tuttle et al. ................. | 361/683 |
| 2002/0118524 A1 | | 8/2002 | Berg, Jr. et al. ............. | 361/796 |

\* cited by examiner

Primary Examiner—Lisa Lea-Edmonds
Assistant Examiner—Anthony Q. Edwards

(57) ABSTRACT

Certain exemplary embodiments of the present invention provide a system for substantially containing a flame, comprising an electrical device enclosure comprising at least one heat-generating electrical device; a substantially planar baffle plate suspended in an aperture defined by said electrical device enclosure, said baffle plate oriented substantially perpendicular to an outlet of a heat-exhausting blower mounted in said electrical device enclosure; and wherein said system meets fire resistance requirements R4-21 and R4-22 of Telcordia standard GR-63-CORE. It is emphasized that this abstract is provided to comply with the rules requiring an abstract that will allow a searcher or other reader to quickly ascertain the subject matter of the technical disclosure. This abstract is submitted with the understanding that it will not be used to interpret or limit the scope or meaning of the claims. 37 CFR 1.72(b).

32 Claims, 5 Drawing Sheets

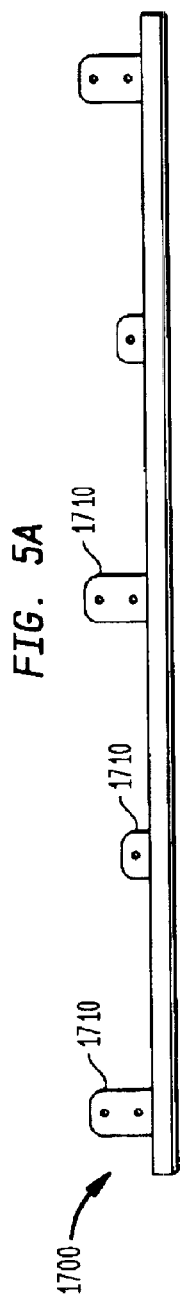
FIG. 5A
FIG. 5B
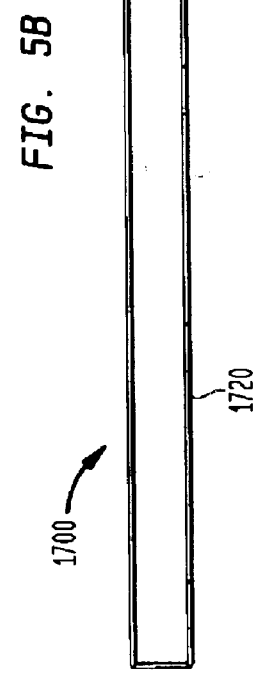
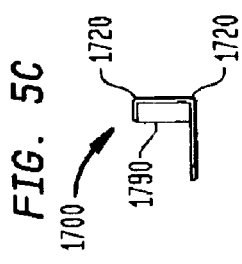
FIG. 5C
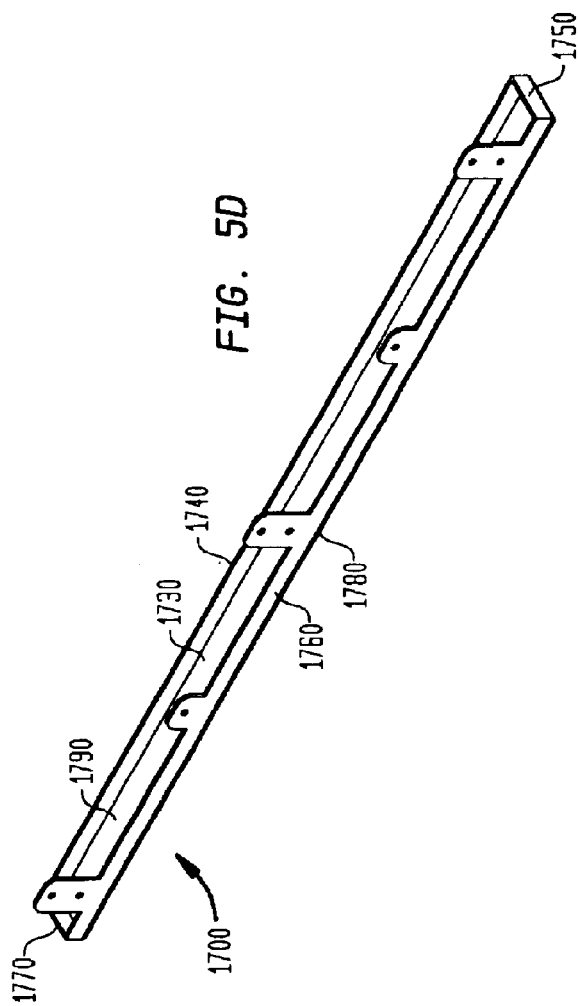
FIG. 5D

BLOWER EXHAUST FOR A CLOSED FRAME

CROSS-REFERENCE TO RELATED APPLICATIONS

This application is related to and claims the benefit of commonly-owned U.S. Provisional Application No. 60/356,430, filed Feb. 12, 2002, titled "Blower Exhaust Baffle for an Enclosed Frame;" which is incorporated by reference herein in its entirety.

BACKGROUND

Networks can be found in many environments, including computer equipment rooms, telephone provider central offices and/or switching centers, and/or manufacturing plant instrumentation centers and/or control rooms. Frequently, networks include at least one circuit board assembly that powers, conditions, modifies, and/or processes a signal, noise, interference, etc. traveling on a circuit of the network.

Each circuit board assembly can be mounted in a rack or other multi-card mounting structure containing a multitude of other circuit board assemblies, all of which can be contained in an electrical device enclosure. Because during operation each such circuit board assembly can generate a substantial amount of heat, there can be a need to exhaust the heat from the enclosure. Yet conventional approaches to exhausting the heat can result in a system that creates too much acoustic noise external to the enclosure, fails to adequately prevent and/or contain flames generated from a fire within the enclosure, and/or fails to prevent unsafe access to the contents of the enclosure.

U.S. Pat. No. 6,198,627, issued to Roehling et al., allegedly discloses that "[a] back cover assembly is provided for use in a device including a housing having a plurality of walls forming an enclosure. A blower mechanism is adapted to cause exhaust air to flow from an interior of the housing to an exterior of the housing. The back cover assembly is located in proximity with the blower mechanism, and includes an acoustical chamber adapted to permit exhaust air from the interior of the housing to pass therethrough. The acoustical chamber is adapted and constructed to reflect acoustical energy back into the blower mechanism. In an embodiment, at least one interior surface of the acoustical chamber is lined with a sound absorbing material such as polyurethane polyester foam. The acoustical chamber can include a front wall with at least one inlet open to blower mechanism, and a rear wall with at least one outlet. The outlet is in fluid communication with the at least one inlet on the front wall, and is open to the exterior of the housing. In order to provide the necessary acoustical reflectivity, the at least one inlet and the at least one outlet can be placed out of axial alignment with one another. For instance, where the at least one inlet is located at a top portion of the front wall, the at least one outlet may be located at a bottom portion of the rear wall. The at least one inlet and outlet can also be located at opposite sides of the chamber. Where there are a plurality of inlets and outlets, the plurality of inlets and outlets may be arranged to form respective inlet/outlet pairs. The acoustical chamber can be provided with at least one divider substantially spanning the space between the front and rear walls. The at least one dividers defines subchambers within the acoustical chamber, with each subchamber enclosing at least one inlet/outlet pair. The device with which the back cover assembly is associated may be provided as a disk array, such as a RAID system. Also disclosed is a method for reducing the amount of noise emitted by a device." See Abstract.

U.S. Pat. No. 6,301,108, issued to Stockbridge, allegedly discloses "[a] fire containment and air flow control mechanism for a device or chassis housing electronic components. The electronic components generate heat during operation of the device. An aperture in the housing permits warm air generated within the chassis to escape into the environment to cool the circuit board or card. A trap door is provided for the aperture for purposes of fire containment. Normally, the trap door is open, allowing the warm air to escape through the aperture. The trap door is moveable relative to the housing between a first position, in which the trap door does not cover the aperture, and a second position, in which the trap door substantially obstructs the aperture. A temperature sensitive material, such as a nylon or other polymeric filament that melts when subject to sufficient heat or flame, is operatively connected to the trap door. The temperature sensitive material is transformed, e.g., by melting, upon exposure to sufficient heat or flame within the device so as to cause the trap door to move to the second position relative to the aperture. In this position, the trap door substantially prevents migration of any flame present within the device through the aperture. For example, the trap door may be held away from the aperture by the filament, and when the filament melts the door swings by gravity or drops into a closed condition relative to the aperture." See Abstract.

SUMMARY

Certain exemplary embodiments of the present invention provide a system for substantially containing a flame, comprising an electrical device enclosure comprising at least one heat-generating electrical device; a substantially planar baffle plate suspended in an aperture defined by said electrical device enclosure, said baffle plate oriented substantially perpendicular to an outlet of a heat-exhausting blower mounted in said electrical device enclosure; and wherein said system meets fire resistance requirements R4-21 and R4-22 of Telcordia standard GR-63-CORE.

Certain exemplary embodiments of the present invention provide a system for reducing noise, comprising an electrical device enclosure; a centrifugal blower mounted in said electrical device enclosure; and a substantially planar baffle plate suspended in an aperture defined by said electrical device enclosure, said baffle plate oriented substantially perpendicular to an outlet of said blower; wherein under normal operation, said system meets acoustic noise requirement R4-72 of Telcordia standard GR-63-CORE and meets electrical safety accessibility requirements R7-2 through R7-11 of Telcordia standard GR-1089-CORE.

Certain exemplary embodiments of the present invention provide a system for reducing noise, comprising an electrical device enclosure; a centrifugal blower mounted in said electrical device enclosure; and a means for substantially impeding an exhaust from said centrifugal blower from flowing perpendicularly across at least approximately 60% of an area of an aperture defined by said electrical device enclosure, said means constructed of a substantially non-flammable monolithic material, said means defining a gap between said electrical device enclosure and said means of no greater than 0.375 inches.

Certain exemplary embodiments of the present invention provide a system for reducing noise, comprising: a centrifugal blower coupled to an enclosure for a heat-generating device; and a means for creating, only upon operation of said blower, an unstructured compressible gas cushion that impedes at least approximately 60 percent of a cross-sectional area of an exhaust flow, and absorbs acoustical noise, from said centrifugal blower, said means blocking finger insertion into an outlet of said blower.

BRIEF DESCRIPTION OF THE DRAWINGS

The invention and its wide variety of potential embodiments will be readily understood via the following detailed description of certain exemplary embodiments, with reference to the accompanying drawings in which:

FIG. 5A is a top view of an exemplary embodiment of a device 1700 of the present invention;

FIG. 5B is a front view of an exemplary embodiment of a device 1700 of the present invention;

FIG. 5C is a side view of an exemplary embodiment of a device 1700 of the present invention; and FIG. 5D is a perspective view of an exemplary embodiment of a device 1700 of the present invention.

DETAILED DESCRIPTION

Figure 1:
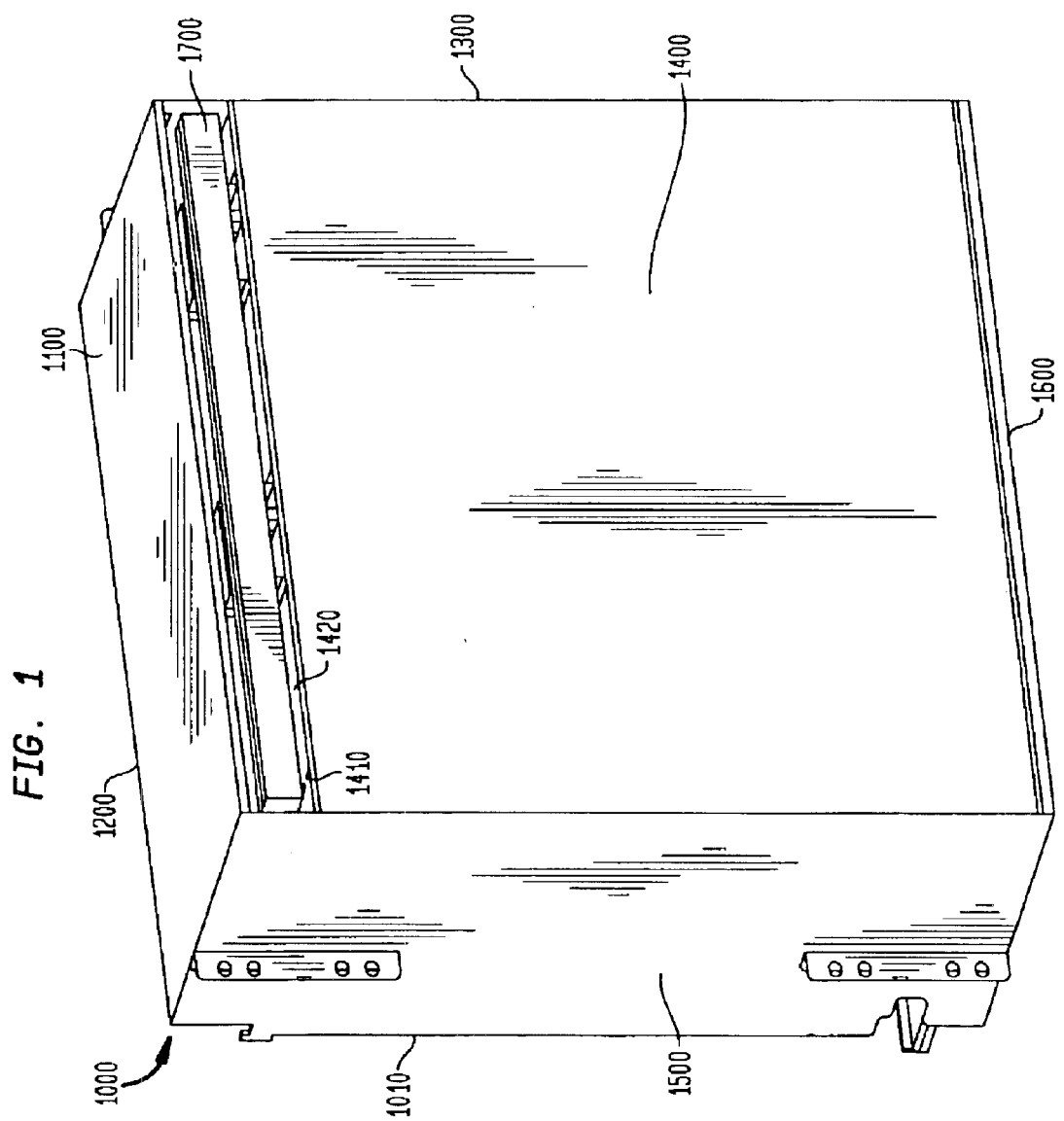
FIG. 1 is a rear perspective view of an exemplary embodiment of a system 1000 of the present invention.

FIG. 1 is a rear perspective view of an exemplary embodiment of a system 1000 of the present invention. System 1000 includes an electrical enclosure 1010 which can enclose any number of heat-generating electrical devices (not shown), such as for example, multiple Telecommunications Equipment Printed Circuit Board Assemblies, such as line cards, control cards, and/or power supplies, etc.

Enclosure comprises top panel 1100, front panel 1200, left side panel 1300, rear panel 1400, right side panel 1500, and bottom panel 1600. Any of panels 1100, 1200, 1300, 1400, 1500, 1600 can be removable from enclosure 1010.

Rear panel 1400 defines at least one aperture 1410 via which heat generated from the heat-generating electrical devices can be exhausted. Suspended within aperture 1410 is at least one baffle 1700, which can impede exhaust flow, attenuate acoustical noise, impede flame spread, and/or prevent fingers and/or tools from accessing a blower (not shown) that is used to ventilate enclosure 1010.

As viewed from the rear of enclosure 1010, baffle 1700 can appear to and/or actually be rectangular in shape and co-planar with aperture 1410, and can appear to and/or actually impede exhaust flow through aperture 1410. As viewed, perhaps somewhat distantly, from the rear of enclosure 1010, baffle 1700 can appear to and/or actually occupy from approximately 50% to approximately 90%, including every value therebetween, of an area of aperture 1410 that is measured on a plane defined by rear panel 1400.

When baffle 1700 is suspended in, and/or impedes air flow through, aperture 1410, the remaining portion of aperture 1410 visible from a rear of enclosure 1010 becomes a gap 1420 that at least partially surrounds baffle 1700. Gap 1420 can extend around the perimeter of baffle 1700. If baffle 1700 is not co-planar with rear panel 1400 (i.e., is offset from rear panel 1400), gap 1420 can have an offset component to its width. The maximum width of gap 1420 in any plane can be from approximately 0.1 inches to approximately 0.4 inches, including every value therebetween, such as for example, approximately 0.125, 0.178, 0.275, 0.25, 0.3125, 0.34, and/or 0.375 inches, etc. The upper bound of the width of cap 1420 can be determined by a safety standard intended to prevent fingers and/or tools from substantially entering enclosure 1010.

As viewed from the rear of enclosure 1010, an area of gap 1420 can appear to and/or actually represent a portion of an area of aperture 1410 that is measured on a plane defined by rear panel 1400. That portion can be approximately 10% to 50%, including every value therebetween, such as 16.1%, 25%, 33.7%, 35%, and 47.5%, etc.

In certain embodiments, more than one aperture 1410 can be provided in enclosure 1010. In certain embodiments, any aperture 1410 can be provided in any panel of enclosure 1010. In certain embodiments, more than one baffle 1700 can be provided in an aperture 1410, thereby defining more than one gap 1420.

Figure 2:
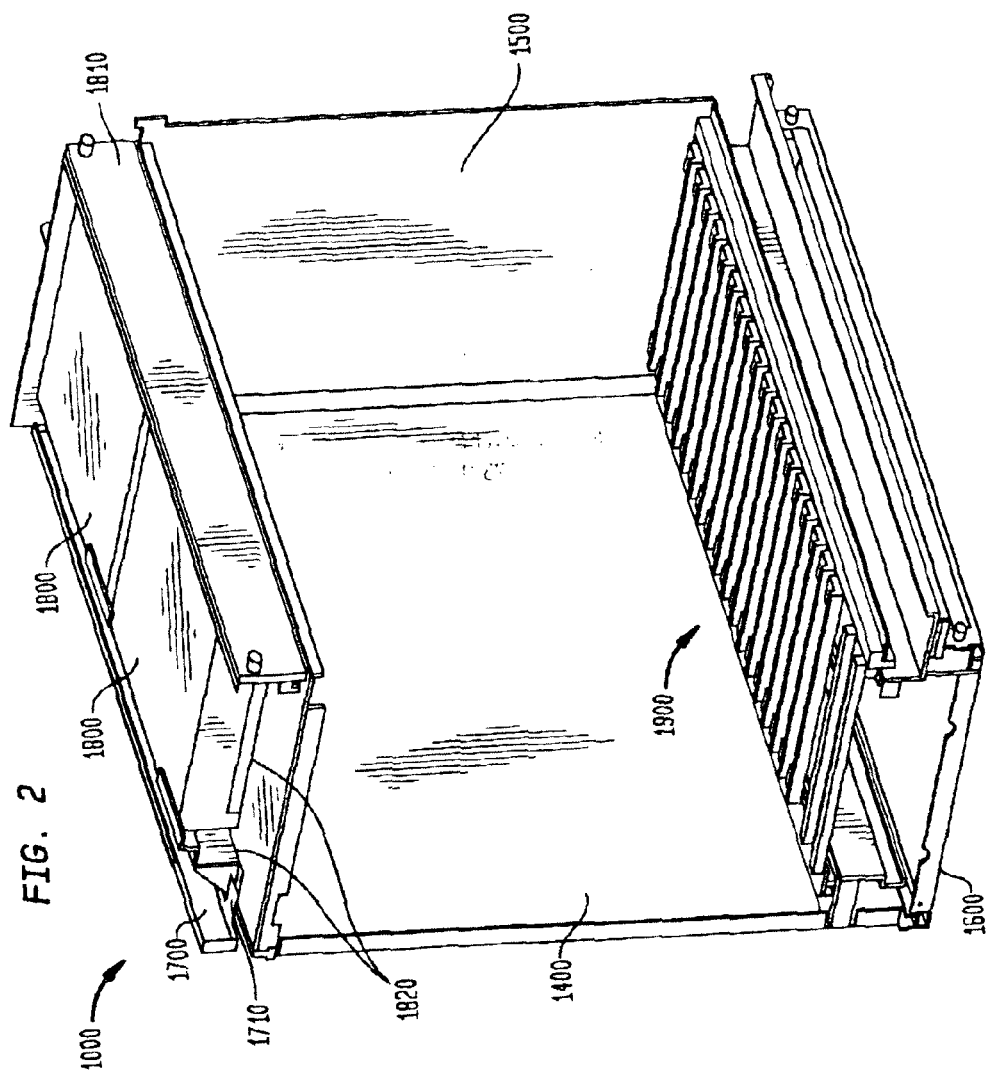
FIG. 2 is a front perspective view of an exemplary embodiment of a system 1000 of the present invention.

FIG. 2 is a front perspective view of an exemplary embodiment of a system 1000 of the present invention. Although top panel 1100, front panel 1200, and left side panel 1300 are not shown, rear panel 1400, right panel 1500, and rear panel 1600 are shown. Also shown are baffle 1700, two blowers 1800, and electrical device mounts 1900. Baffle 1700 can be mounted to enclosure 1010 via baffle supports 1710.

Either of blowers 1800 can be centrifugal, hot-swappable, redundant, and/or supply up to 100% of the required capacity. Blowers 1800 can be rigidly and/or non-fixedly mounted in enclosure 1010. One manufacturer of such centrifugal blowers is Rittal Corporation, of Springfield, Ohio, which supplies the VME64x/CompactPCI RiCool Blower Assembly, model numbers 3344 and 3686. Blower access door 1810 provides access for installing or removing blowers 1800, which can be supported and/or constrained by blower mounting structure 1820.

Figure 3:
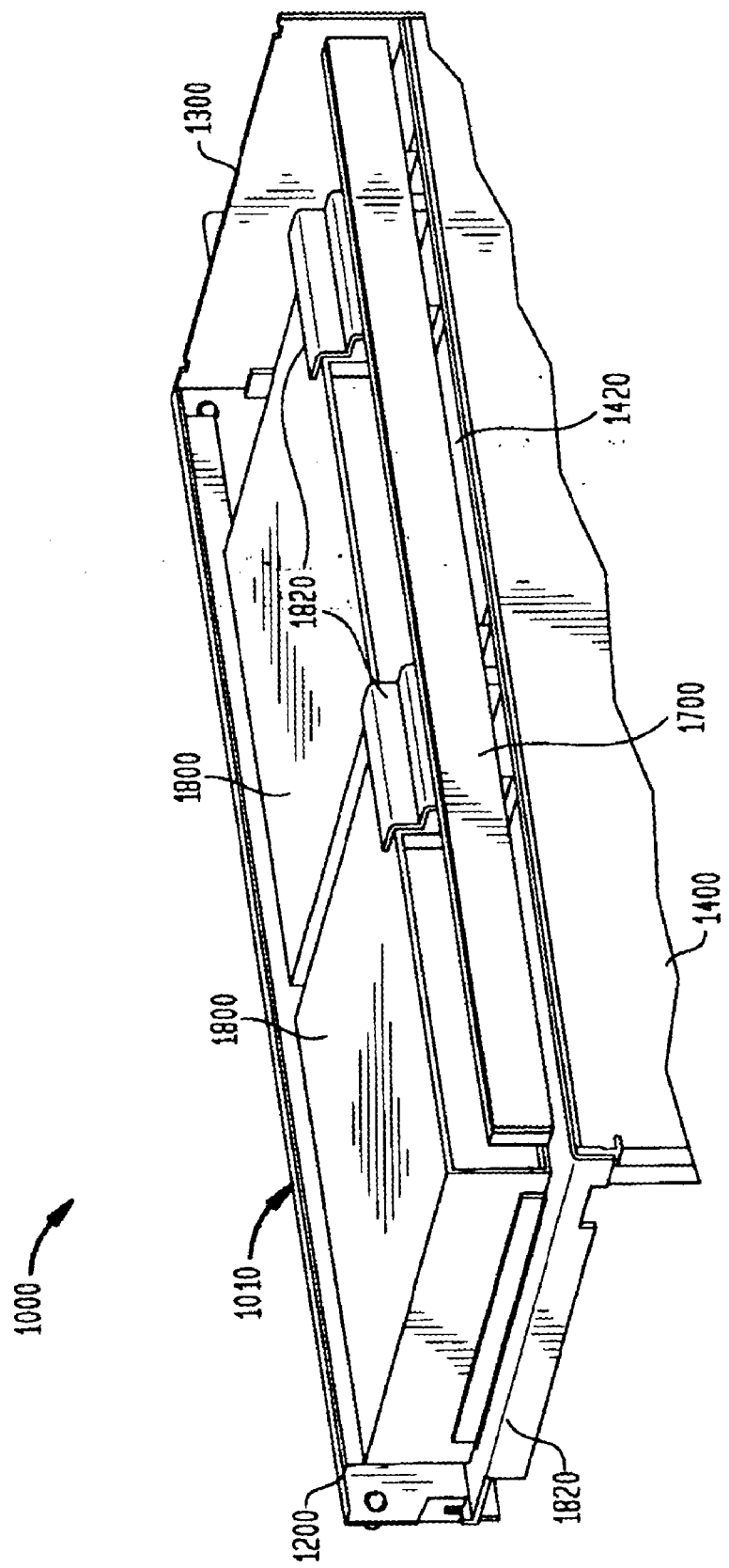
FIG. 3 is a partial rear perspective view of an exemplary embodiment of a system 1000 of the present invention.

FIG. 3 is a partial rear perspective view of an exemplary embodiment of a system 1000 of the present invention. Shown are a portion of enclosure 1010 comprising front panel 1200, left panel 1300, back panel 1400, and blower mounting structure 1820. Top panel 1100, right panel 1500, and bottom panel 1600 are not shown. Also shown are gap 1420, baffle 1700, and blowers 1800. Note that baffle 1700 can be coplanar to back panel 1400 or can be recessed slightly into enclosure 1010.

Figure 4:
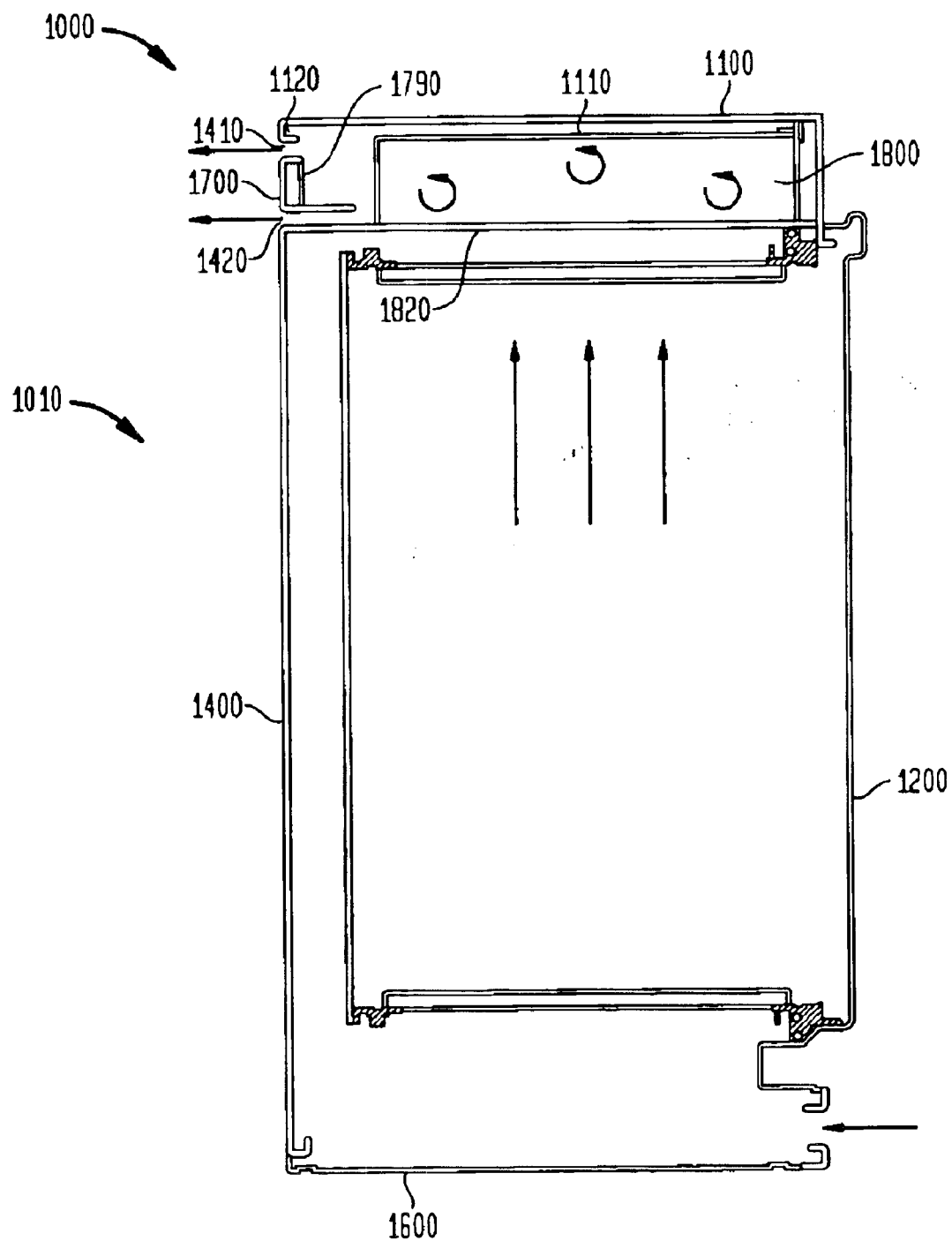
FIG. 4 is a air flow diagram of an exemplary embodiment of a system 1000 of the present invention.

FIG. 4 is an air flow diagram of an exemplary embodiment of a system 1000 of the present invention, viewed from the left side of enclosure 1010. Shown is top panel 1100, enclosure pocket 1120, front panel 1200, rear panel 1400, bottom panel 1600, baffle 1700, baffle pocket 1790, blowers 1800, and blower mounting structure 1820.

Cooling air can enter a front of enclosure 1010, such as below front panel 1200, can turn 90 degrees and flow upwards across the heat-generating electrical devices (not shown). The heated air can then enter the intake of centrifugal blowers 1800, turbulently exiting at a 90 degree angle to the intake. The turbulently flowing air (indicated by the circular arrows) can then encounter baffle 1700, baffle pocket 1790, and/or enclosure pocket 1120, either of which can substantially impede the flow of the air. Although convention wisdom suggests that impeding airflow is typically undesirable, baffle 1700, baffle pocket 1790, and/or enclosure pocket 1120 can cause at least a partial smoothing of the turbulent flow, thereby reducing its Reynolds number, and possibly causing it to enter the laminar regime. Blower 1800 can be selected and/or sized to account for the reduced airflow, increased pressure drop, and/or increased backpressure. Baffle 1700, baffle pocket 1790, enclosure pocket 1120, and/or plenum 1110, which is formed between top panel 1100 and the housings of blowers 1800, can cause a buffering, attenuation, damping, and/or absorption of a portion of the acoustical energy (e.g., noise) created by blowers 1800 and/or exiting air.

FIGS. 5A–5D are various views of an exemplary embodiment of baffle 1700 of the present invention. FIG. 5A is a top view of baffle 1700, showing baffle supports 1710. FIG. 5B is a back view of baffle 1700, showing trailing peripheral edges 1720. To better streamline, smooth, and/or reduce the Reynolds number of the air flow exiting via gap 1420, trailing peripheral edges 1720 can be formed and/or smoothed to a radius of between approximately 1 millimeter and approximately 4 millimeters, including all values therebetween, such as 1.34, 1.6, 2.0, 2.25, 2.56, 3.00, and/or 3.33 millimeters, etc. FIG. 5C is a side view of baffle 1700, showing trailing peripheral edges 1720 and baffle pocket 1790.

FIG. 5D is a bottom perspective view of baffle 1700, showing various components of baffle 1700, including perpedicular member 1730, top member 1740, right member 1750, bottom member 1760, left member 1770, and back face 1780. Any of members 1730–1770 can be a solid, continuous, unitary, and/or monothithic object, such as a planar plate, and/or can include a predetermined number of pressure-reducing passages. Members 1730–1770 can be welded together or created via a stamping or forming operation to form baffle pocket 1790. A depth of baffle pocket 1790 can be predetermined and/or selected to provide a desired amount of noise reduction, air flow reduction, pressure increase, and/or back-pressure increase, and typically can be selected from a range of approximately 1 millimeter to approximately 40 millimeters, and all values therebetween, such as for example, approximately: 1.52, 4.25, 6, 7.5, 10, 12.48, 16.33, 19.89, 22.5, 25, 31.6, and/or 36.66 millimeters. Similarly, as shown on FIG. 4, any portion of enclosure 1010 adjacent to aperture 1410, such as top panel 1100, can be formed with an enclosure pocket 1120 having a similarly predetermined and/or selected depth.

Although convention wisdom typically suggests that impeding airflow is undesirable, during operation of one or more of blowers 1800, baffle pocket 1790 and/or enclosure pocket 1120 (shown on FIG. 4) can cause the creation and/or at least partially contain an unstructured compressible gas cushion comprising solely exhaust air. That is, other than baffle 1700 and/or enclosure 1010, no foam, fabric, fiber, or other structure is necessary to contain and/or encapsulate the cushion. Thus, the cushion can form dynamically upon blower operation, and can dampen eddies and/or absorb kinetic and/or acoustic energy from the exhaust, thereby reducing turbulence and/or noise.

In certain embodiments, more than one baffle 1700 can be provided, and thus, more than one baffle pocket 1790 can be provided. In certain embodiments, baffle pocket 1790 can be at least partially subdivided by, for example, ribs attached to baffle 1700, thereby forming multiple sub-pockets. In certain embodiments, any surface of baffle 1700 and/or enclosure 1010 can be smoothed, roughened, dimpled, coated, treated, and/or formed to improve its performance.

Baffle 1700 can be constructed of a substantially non-flammable and/or non-flame supporting material, such as a metal, ceramic, and/or composite thereof. For example, baffle 1700 can be constructed from aluminum, carbon steel, or stainless steel. Although baffle supports 1710 are shown as attached to bottom member 1760, baffle supports 1710 can be attached and/or integral to any member 1730–1770. Moreover, baffle supports 1710 can attach baffle in any manner to enclosure 1010.

Various parameters of system 1000 can be analyzed, tested, designed, and/or selected to optimize performance of system 1000. Such parameters can include number of baffles, baffle arrangement, baffle shape, baffle size, baffle thickness, aperture location, baffle location within the aperture, number of pockets, pocket depth, sub-pocket design, baffle material, baffle surface, panel material, panel surface, panel thickness, gap length, gap width, gap offset dimension, blower flowrate, blower outlet pressure, blower back-pressure, number of blowers, blower location, enclosure configuration, and/or enclosure dimensions, etc.

System 1000 can meet various standards and/or requirements for acoustic noise reduction, flame spread containment, and/or electrical safety accessibility. For example, system 1000 can meet fire resistance requirements R4-21 and R4-22 of Telcordia Technologies' standard GR-63-CORE, which correspond to former Bellcore standard GR-63, requirements 85 and 86, respectively. As another example, system 1000 can meet acoustic noise requirement R4-72 of Telcordia Technologies' standard GR-63-CORE, which corresponds to former Bellcore standard GR-63, requirement 128. As yet another example, system 1000 can meet electrical safety accessibility requirements R7-2 through R7-11 of Telcordia Technologies' standard GR-1089-CORE, which correspond to former Bellcore standard GR-1089, requirements 54 through 63.

Consistent with meeting acoustic noise requirement R4-72 of Telcordia standard GR-63-CORE, under normal operation, system 1000 can produce a sound level of less than 60 dBA. Consistent with meeting electrical safety accessibility requirements R7-2 through R7-11 of Telcordia standard GR-1089-CORE, system 1000 can prevent a human from inserting a finger into the outlet of blower 1700.

Although the invention has been described with reference to specific exemplary embodiments thereof, it will be understood that numerous variations, modifications and additional embodiments are possible, and accordingly, all such variations, modifications, and embodiments are to be regarded as being within the spirit and scope of the invention. Also, references specifically identified and discussed herein are incorporated by reference as if fully set forth herein. Accordingly, the drawings and descriptions are to be regarded as illustrative in nature, and not as restrictive.

What is claimed is:

1. A system for substantially containing a flame, comprising:
    an electrical device enclosure comprising at least one heat-generating electrical device;
    a substantially planar baffle plate suspended in an aperture defined by said electrical device enclosure, said baffle plate oriented substantially perpendicular to an outlet of a heat-exhausting blower mounted in said electrical device enclosure; and
    wherein said system meets fire resistance requirements R4-21 and R4-22 of Telcordia standard GR-63-CORE as in effect on 12 Feb. 2003.

2. The system of claim 1, further comprising an enclosure pocket disposed adjacent said aperture.

3. The system of claim 1, further comprising said blower.

4. The system of claim 1, further comprising said blower, said blower rigidly mounted in said electrical device enclosure.

5. The system of claim 1, further comprising said blower, said blower non-fixedly mounted in said electrical device enclosure.

6. The system of claim 1, further comprising said blower, said blower rigidly and non-fixedly mounted in said electrical device enclosure.

7. The system of claim 1, further comprising said blower, said blower surrounded by a plenum at least partially defined by said electrical device enclosure.

8. The system of claim 1, wherein said blower is hot-swappable.

9. The system of claim 1, wherein an exhaust gap defined between a periphery of said baffle plate and said electrical device enclosure is no larger than 0.375 inches in width.

10. The system of claim 1, wherein an exhaust gap defined between a periphery of said baffle plate and said electrical device enclosure defines an area that is no less than 20% of an area of said aperture.

11. The system of claim 1, wherein an exhaust gap defined between a periphery of said baffle plate and said electrical device enclosure defines an area that is no larger than 35% of an area of said aperture.

12. The system of claim 1, wherein said baffle plate defines a plurality of trailing peripheral edges each having a radius of between 1 millimeters and 3 millimeters.

13. The system of claim 1, wherein said baffle plate defines a plurality of trailing peripheral edges each having a radius of no less than 1 millimeter.

14. The system of claim 1, wherein said baffle plate defines a plurality of trailing peripheral edges each having a radius of no greater than 4 millimeters.

15. The system of claim 1, wherein said heat-generating electric device is a Telecommunications Equipment Printed Circuit Board Assembly.

16. A system for reducing noise, comprising:

an electrical device enclosure;

a centrifugal blower mounted in said electrical device enclosure; and a substantially planar baffle plate suspended in an aperture defined by said electrical device enclosure, said baffle plate oriented substantially perpendicular to an outlet of said blower;

wherein under normal operation, said system meets acoustic noise requirement R4-72 of Telcordia standard GR-63-CORE and meets electrical safety accessibility requirements R7-2 through R7-11 of Telcordia standard GR-1089-CORE, as in effect on 12 Feb. 2003.

17. The system of claim 16, further comprising an enclosure pocket disposed adjacent said aperture.

18. The system of claim 16, wherein under normal operation, said system produces a sound level of less than 60 dBA.

19. The system of claim 16, wherein an exhaust gap defined between a periphery of said baffle plate and said electrical device enclosure is no larger than 0.375 inches in width.

20. The system of claim 16, wherein an exhaust gap defined between a periphery of said baffle plate and said electrical device enclosure defines an area that is no less than 20% of an area of said aperture.

21. The system of claim 16, wherein an exhaust gap defined between a periphery of said baffle plate and said electrical device enclosure defines an area that is no larger than 35% of an area of said aperture.

22. The system of claim 16, wherein said baffle plate defines a plurality of trailing peripheral edges each having a radius of between 1 millimeters and 3 millimeters.

23. The system of claim 16, wherein said baffle plate defines a plurality of trailing peripheral edges each having a radius of no less than 1 millimeter.

24. The system of claim 16, wherein said baffle plate defines a plurality of trailing peripheral edges each having a radius of no greater than 4 millimeters.

25. The system of claim 16, wherein said blower is rigidly but non-fixedly mounted in said electrical device enclosure.

26. The system of claim 16, wherein said blower is hot-swappable.

27. The system of claim 16, further comprising a plurality of heat-generating electrical devices mounted at least partially within said electrical device enclosure.

28. The system of claim 16, further comprising a plurality of heat-generating Telecommunications Equipment Printed Circuit Board Assemblies mounted at least partially within said electrical device enclosure.

29. A system for reducing noise, comprising:

an electrical device enclosure;

a centrifugal blower mounted in said electrical device enclosure; and a means for substantially impeding an exhaust from said centrifugal blower from flowing perpendicularly across at least approximately 60% of an area of an aperture defined by said electrical device enclosure, said means constructed of a substantially non-flammable monolithic material, said means defining a gap between said electrical device enclosure and said means of no greater than 0.375 inches, said gap being coplanar with said aperture.

30. The system of claim 29, wherein under normal operation, said system meets acoustic noise requirement R4-72 of Telcordia standard GR-63-CORE, as in effect on 12 Feb. 2003.

31. The system of claim 29, wherein under normal operation, said system meets meets electrical safety accessibility requirements R7-2 through R7-11 of Telcordia standard GR-1089-CORE, as in effect on 12 Feb. 2003.

32. A system for reducing noise, comprising:

a centrifugal blower coupled to an enclosure for a heat-generating device; and a means for creating, only upon operation of said blower, an unstructured compressible gas cushion that impedes at least approximately 60 percent of a cross-sectional area of an exhaust flow, and absorbs acoustical noise, from said centrifugal blower, said means blocking finger insertion into an outlet of said blower, said finger insertion blocking means being coplanar with said cross sectional area of said exhaust flow.

* * * * *